(12) United States Patent
Suehiro

(10) Patent No.: US 8,344,521 B2
(45) Date of Patent: Jan. 1, 2013

(54) SEMICONDUCTOR DEVICE, SEMICONDUCTOR PACKAGE AND WIRING STRUCTURE

(75) Inventor: Mitsuo Suehiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 12/795,963

(22) Filed: Jun. 8, 2010

(65) Prior Publication Data

US 2010/0327441 A1   Dec. 30, 2010

(30) Foreign Application Priority Data

Jun. 24, 2009   (JP) .................................. 2009-149331

(51) Int. Cl.
*H01L 23/488* (2006.01)

(52) U.S. Cl. ......... 257/778; 257/E23.023; 257/E23.069; 257/738

(58) Field of Classification Search .................. 257/777, 257/738, E23.023, E23.069, 778, 668, 698, 257/700, 254

See application file for complete search history.

(56) References Cited

U.S. PATENT DOCUMENTS

| 6,042,894 A | 3/2000 | Goto et al. |
| 7,566,960 B1 * | 7/2009 | Conn ............................ 257/686 |
| 7,692,296 B2 | 4/2010 | Tanaka et al. |

FOREIGN PATENT DOCUMENTS

| JP | 8-78075 A | 3/1996 |
| JP | 2005-268706 A | 9/2005 |

* cited by examiner

*Primary Examiner* — S. V. Clark
*Assistant Examiner* — Krista Soderholm
(74) *Attorney, Agent, or Firm* — Fujitsu Patent Center

(57) ABSTRACT

A semiconductor device includes a semiconductor package, a circuit board, an interconnection electrically connecting the semiconductor package and the circuit board, and a wiring structure. The wiring structure includes a through hole, a contact disposed at the through hole and a lead pattern extending from the contact. The wiring structure is disposed between the semiconductor package and the circuit board. The interconnection passes through the through hole and connects with the contact.

16 Claims, 19 Drawing Sheets

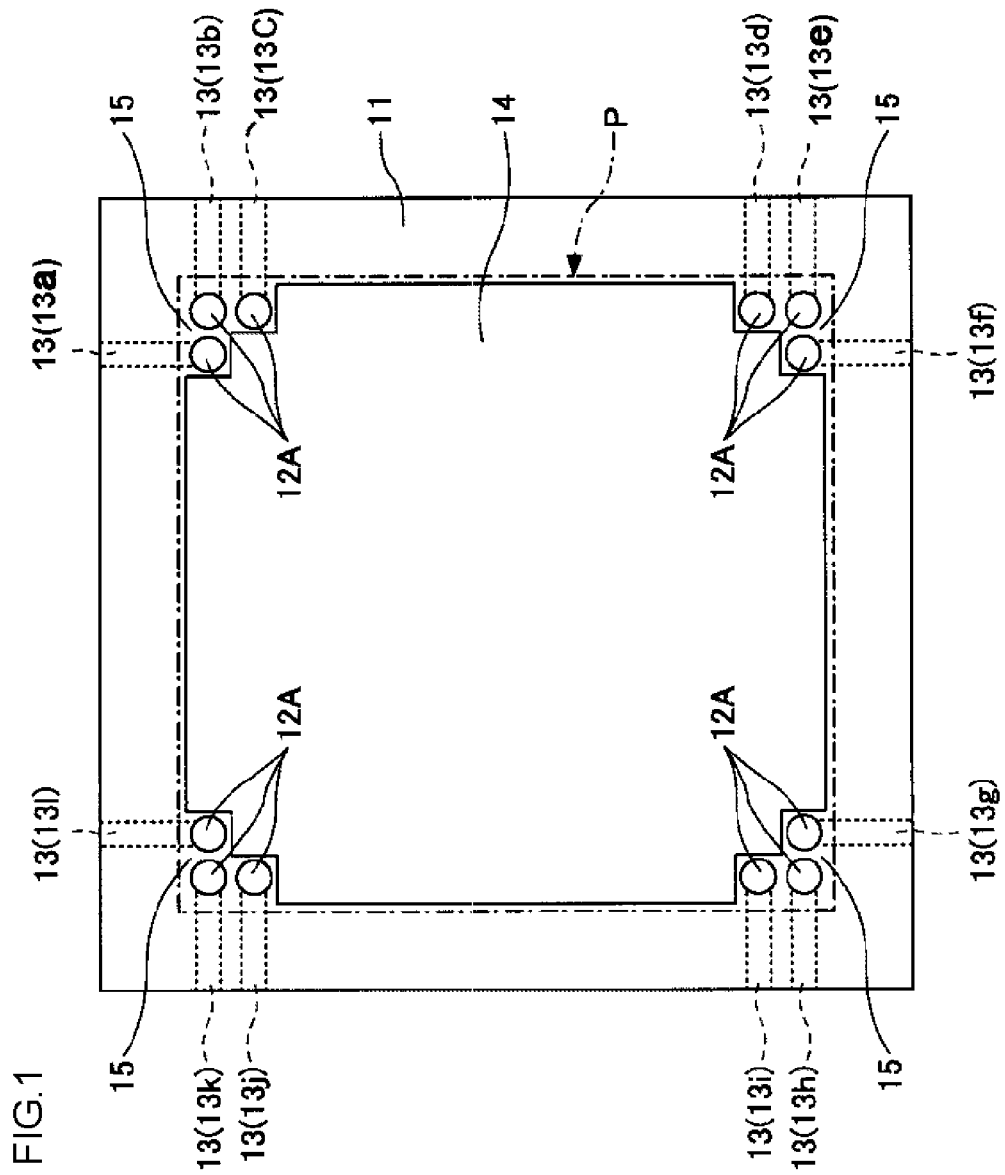

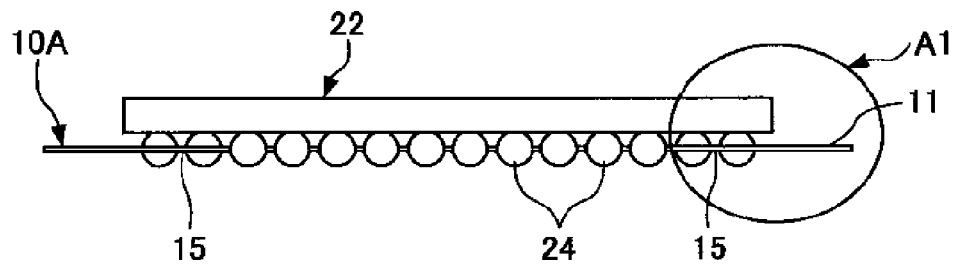
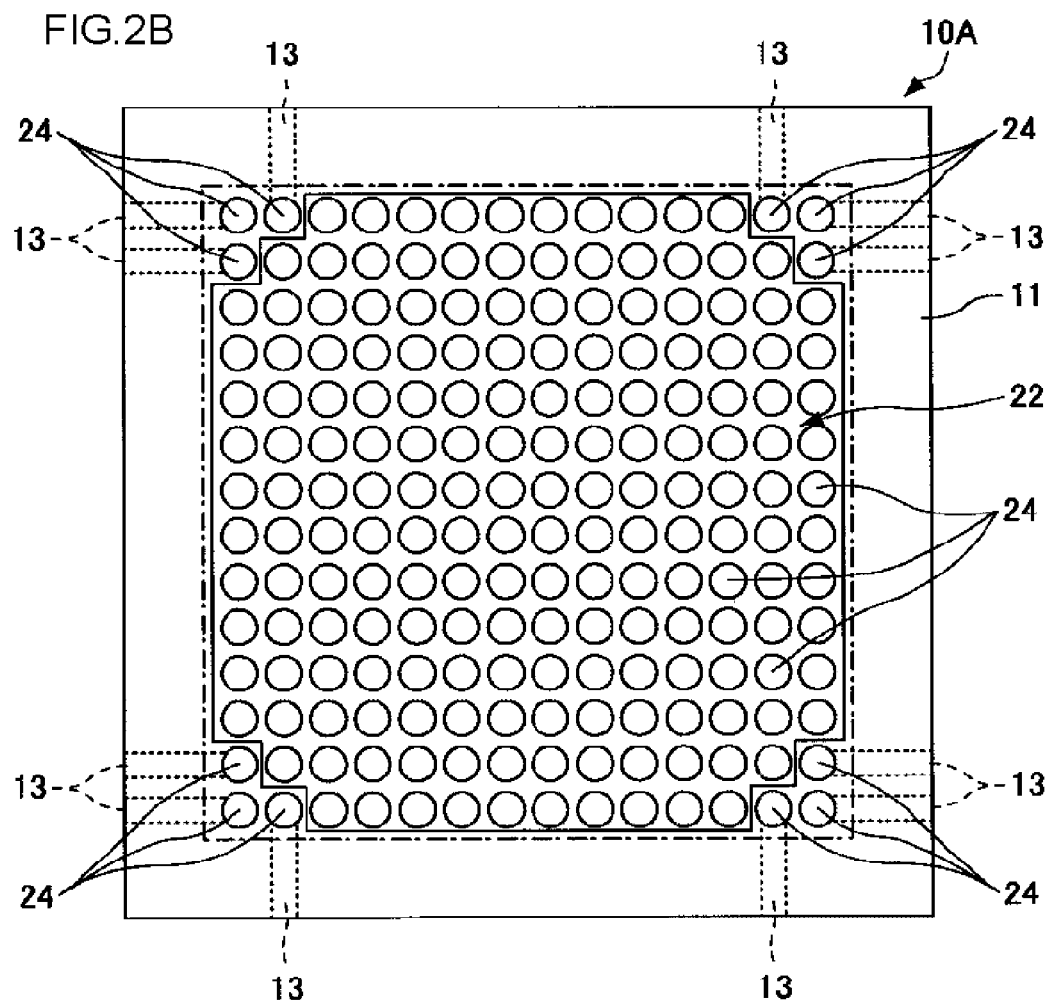

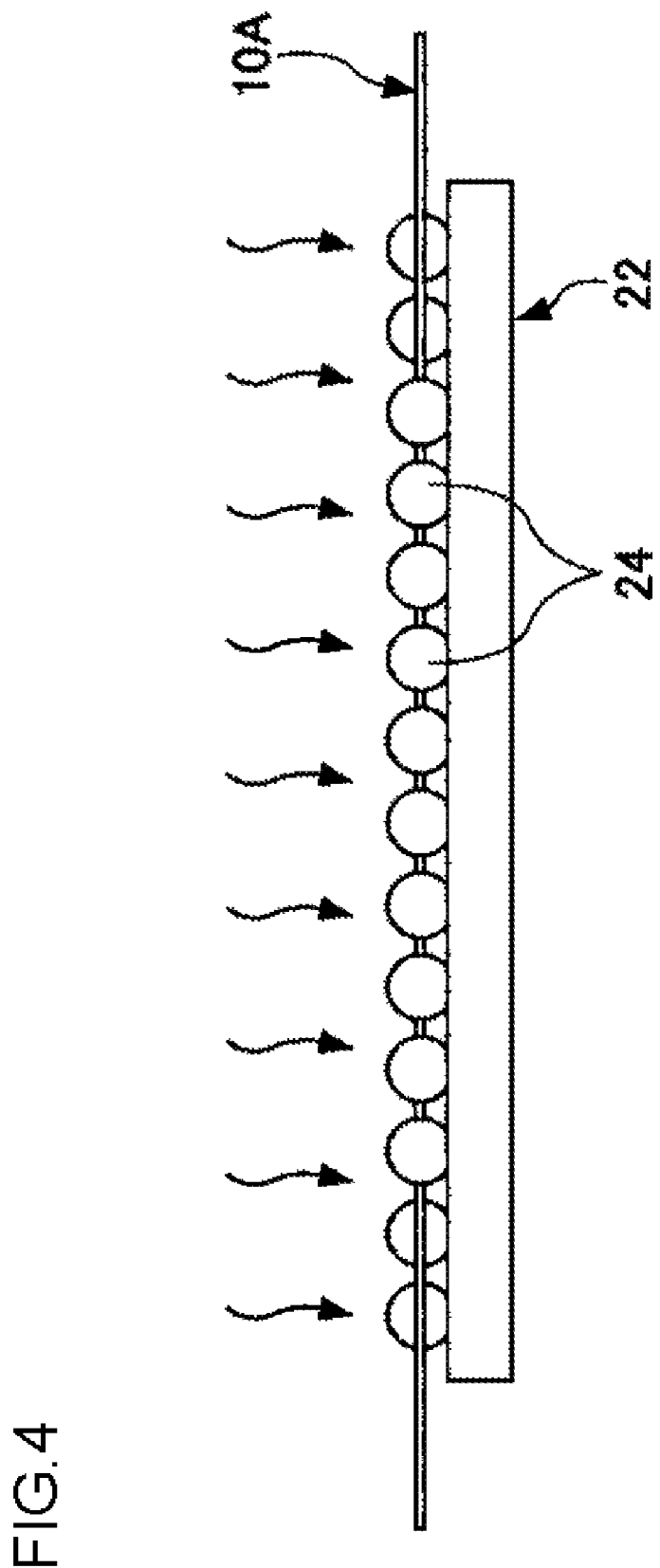

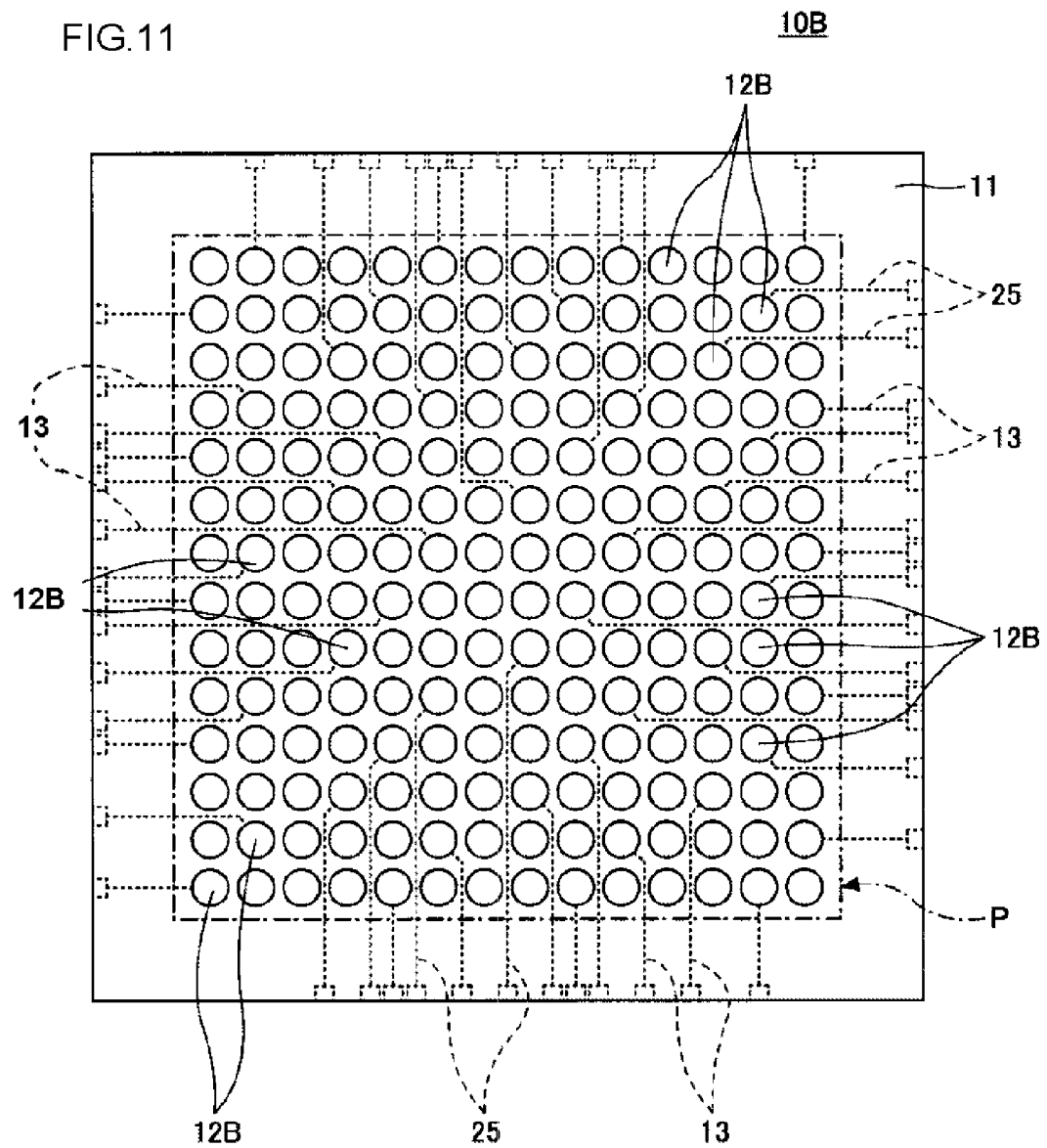

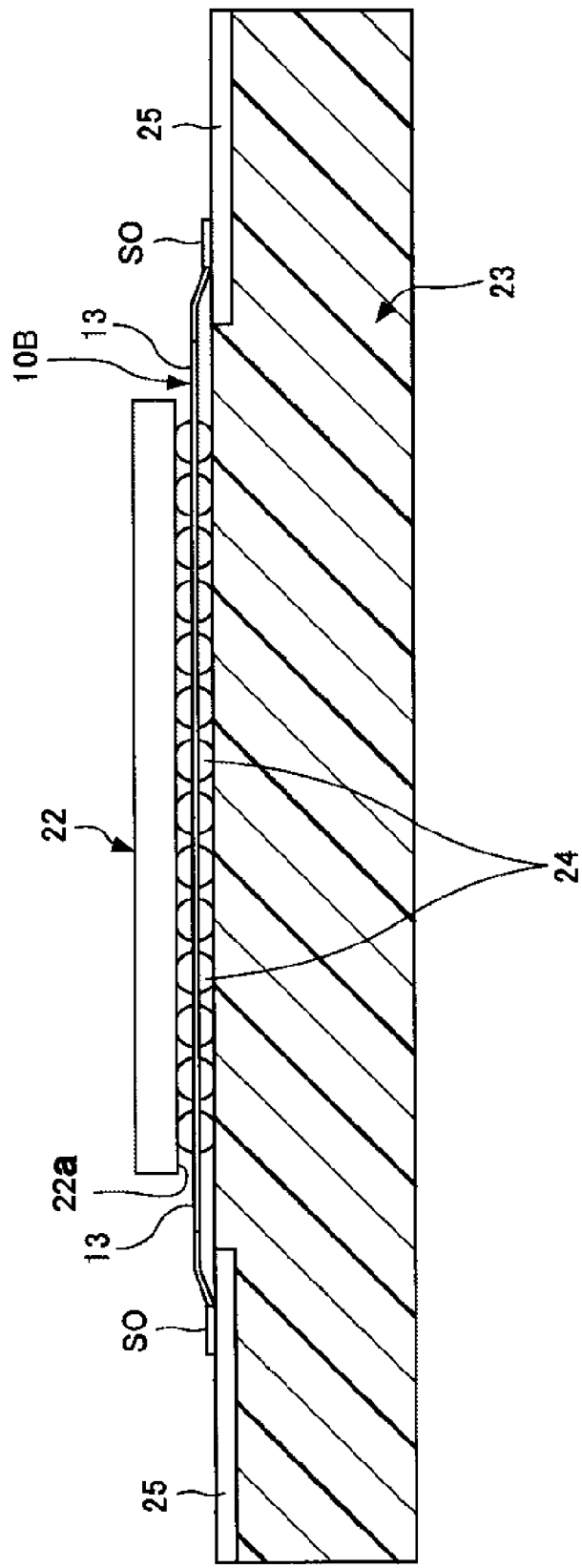

SEMICONDUCTOR DEVICE, SEMICONDUCTOR PACKAGE AND WIRING STRUCTURE

CROSS-REFERENCE TO RELATED APPLICATION

This application is based upon and claims the benefit of priority of the prior Japanese Patent Application No. 2009-149331, filed on Jun. 24, 2009, the entire contents of which are incorporated herein by reference.

FIELD

The embodiments discussed herein are related to a semiconductor device, semiconductor package and a wiring structure.

BACKGROUND

A ball grid array (BGA) is generally known as a semiconductor package structure that is mounted on a printed circuit board with high density. The BGA allows a semiconductor package to be mounted on a printed circuit board by joining solder balls provided for the semiconductor package to the printed circuit board.

In some cases, a recent increase in size of semiconductor packages and printed circuit boards causes curving (warping) of a printed circuit board when a semiconductor package is mounted on the printed circuit board. If the printed circuit board is caused to curve, a load is applied to a BGA joining portion, so that a crack (hereinafter, referred to as "solder crack") may occur in a solder ball.

According to a method of detecting the occurrence of such a solder crack, a semiconductor package including solder balls connected in a daisy chain pattern and an evaluation board in which a daisy chain pattern corresponding to the above daisy chain pattern is formed are prepared, the semiconductor package is mounted on the evaluation board, and the resistance (hereinafter, "connection resistance") of connection between the solder balls and pattern segments are measured. If a solder crack occurs in at least one portion, the connection resistance increases. The increase in connection resistance is detected, so that the occurrence of an abnormality is determined.

Another method of detecting a solder crack uses a strain gauge that is placed in a position near a corner of a semiconductor package mounted on a printed circuit board. According to this method, mechanical stress (strain) which occurs in a surface of a substrate of a printed circuit board is measured using the strain gauge. Instead of a resistance, fracture life (allowable strain) leading to a solder crack is estimated on the basis of the result of measurement.

As for the method using the daisy chain pattern, however, which solder ball has an abnormality, namely, a position where the abnormality has occurred may not be specified because all of the solder balls are connected in the daisy chain pattern. In order to specify the position where the abnormality has occurred, it is therefore necessary to perform destructive inspection on, for example, the cross section. Disadvantageously, it takes time to specify the position where the abnormality has occurred.

In addition, since the daisy chain pattern is an evaluation pattern in which all of the solder balls are connected (short-circuited), it is impossible to set the daisy chain pattern on a printed circuit board to be an actual product. Disadvantageously, an abnormality of a solder ball may not be detected in a product which will be actually shipped by the method using the daisy chain pattern.

According to the other method using a strain gauge which is placed on a printed circuit board, strain is detected only in a measurement position that is apart from positions where solder balls are actually joined. Disadvantageously, the accuracy of estimation of fracture life is reduced.

Japanese Laid-open Patent Publication No. 2005-268706 is example of related art.

SUMMARY

According to an aspect of the invention, a semiconductor device includes a semiconductor package; a circuit board; an interconnection electrically connecting the semiconductor package and the circuit board; and a wiring structure including a through hole, a contact disposed at the through hole and a lead pattern extending from the contact, the wiring structure disposed between the semiconductor package and the circuit board, wherein the interconnection passes through the through hole and connects with the contact.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a plan view of a wiring structure according to a first embodiment.

FIGS. 2A to 2C are diagrams illustrating the wiring structure according to the first embodiment attached to a semiconductor package.

FIG. 4 is a diagram explaining a reflow process performed when the wiring structure according to the first embodiment is attached to the semiconductor package.

FIG. 11 is a plan view of a wiring structure according to a second embodiment.

FIG. 12 is a cross-sectional view of a semiconductor device including the wiring structure according to the second embodiment.

DESCRIPTION OF EMBODIMENTS

Figure 2C:
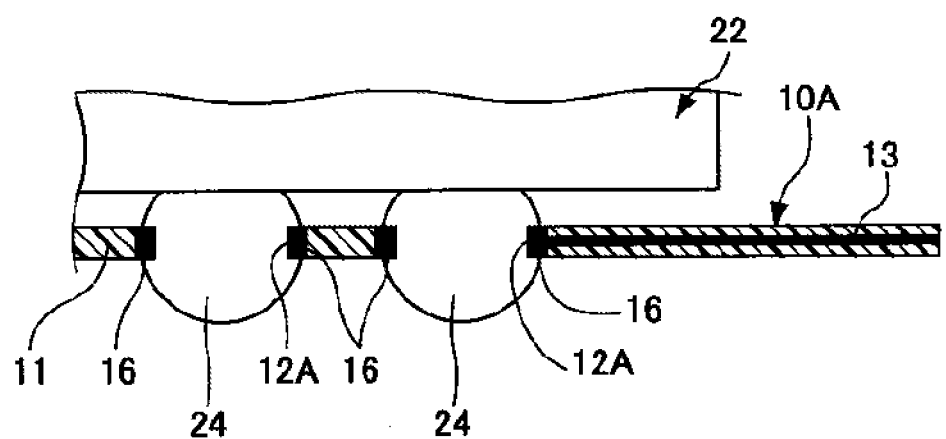

FIG. 1 is a plan view of a wiring film 10A according to a first embodiment. FIG. 2A is a cross-sectional view of the wiring film 10A attached to a semiconductor package 22. FIG. 2B is a plan view of the bottom surface of the wiring film 10A attached to the semiconductor package 22. FIG. 2C is an enlarged view of part indicated by the arrow A1 in FIG. 2A.

The wiring film 10A includes, for example, an insulating sheet member 11, through-holes 12A, and a lead pattern 13. This wiring film 10A is mounted on a printed circuit board 23 while being attached to the semiconductor package 22 and is used for detection of a solder crack 27 that may occur in a solder ball 24.

The insulating sheet member 11 is a resin film laminate including two resin sheet-shaped films and has a thickness of 50 μm. A resin material for the insulating sheet member 11 has to have an insulating property and be resistant to heat for reflow, which will be described below. Specifically, polyimide is preferably used as a resin material for the insulating sheet member 11 but the resin material is not limited to this. For example, polyester may be used. The thickness of the insulating sheet member 11 is not limited to 50 μm. The thickness thereof may be appropriately selected in the range of 30 μm to 100 μm.

The insulating sheet member 11 is formed so as to be larger than the outer shape of the semiconductor package 22. The insulating sheet member 11 further has an opening 14 in the center thereof and is therefore shaped in a frame as a whole. Furthermore, the insulating sheet member 11 integrally has extensions 15 such that each extension 15 inwardly extends from the corresponding corner of the frame-shaped insulating sheet member 11. In the embodiment, three through-holes 12A are arranged in each of four extensions 15 in the corners.

The through-holes 12A are arranged so as to correspond to three solder balls 24, placed in each corner, of solder balls 24 arranged in a grid pattern on the bottom surface 22a of the semiconductor package 22. This arrangement will be described with reference to FIGS. 2A to 2C.

Referring to FIG. 2B, the solder balls 24 are arranged in the grid pattern on the bottom surface 22a of the semiconductor package 22. The formation positions of the through-holes 12A are set so as to correspond to the placement positions of the three solder balls 24 in each corner of the semiconductor package 22. Accordingly, when the wiring film 10A is attached to a predetermined position of the semiconductor package 22, the three solder balls 24 in each corner of the semiconductor package 22 are attached to the through-holes 12A, respectively, and the other solder balls 24 are positioned in the opening 14.

When let a denote the diameter of the solder ball 24, the diameter D of the through-hole 12A is four fifths the diameter a (D=⅘×a). In other words, the diameter of the through-hole 12A is smaller than that of the solder ball 24 on the semiconductor package 22 (refer to FIG. 3B).

The lead pattern 13 is provided between the two resin films constituting the insulating sheet member 11. Accordingly, the lead pattern 13 is embedded in the insulating sheet member 11 (refer to FIG. 2C). In the embodiment, a copper pattern is used as the lead pattern 13. The lead pattern 13 is not limited to this and an aluminum or gold pattern may be used.

Each lead pattern segment 13 extends from the outer edge of the through-hole 12A to the end of the insulating sheet member 11. An exposed electrode 16 is disposed in the outer edge of each through-hole 12A. The inner end of each lead pattern segment 13 is connected to the exposed electrode 16. The insulating sheet member 11 is partially removed such that the outer end of each lead pattern segment 13 is exposed. The exposed portions are connected to a monitoring pattern 25 of the printed circuit board 23, as will be described below.

The lead pattern segments 13 are formed so as to correspond to the through-holes 12A, respectively. Accordingly, 12 lead pattern segments 13 are arranged so as to be equal in number to the arranged through-holes 12A. To specify and describe the individual lead pattern segments, the lead pattern segments will be termed lead pattern segments 13a to 13l.

Figure 3A:
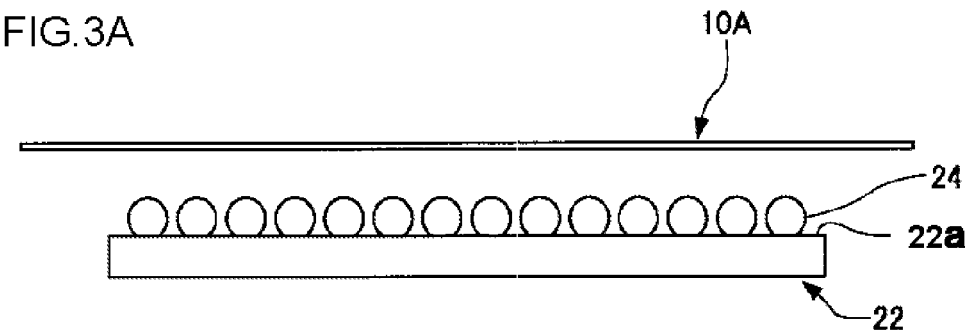
FIGS. 3A and 3B are diagrams explaining an alignment process performed when the wiring structure according to the first embodiment is attached to the semiconductor package.
Figure 3B:
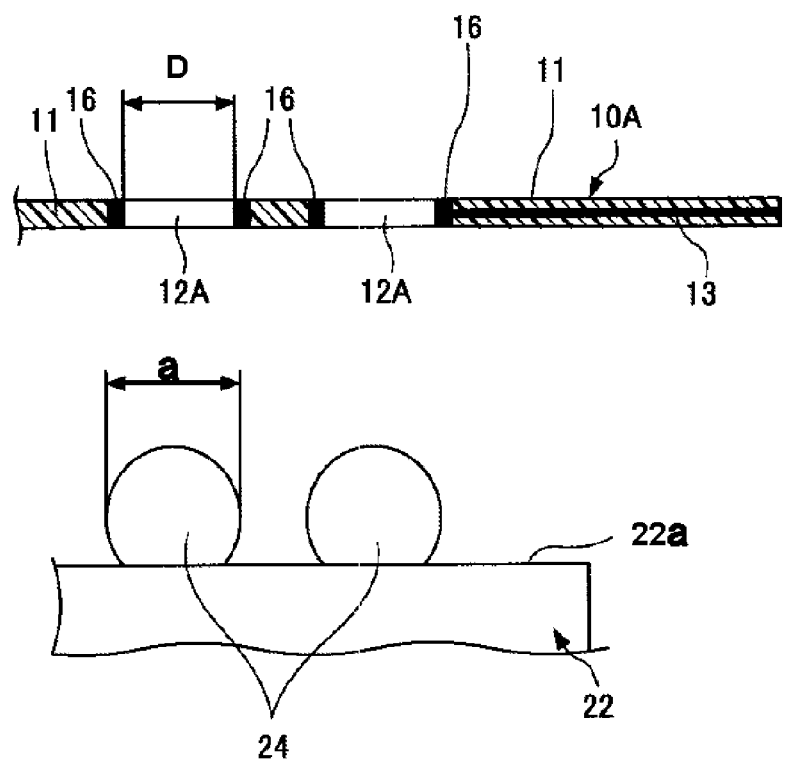
Figure 5A:
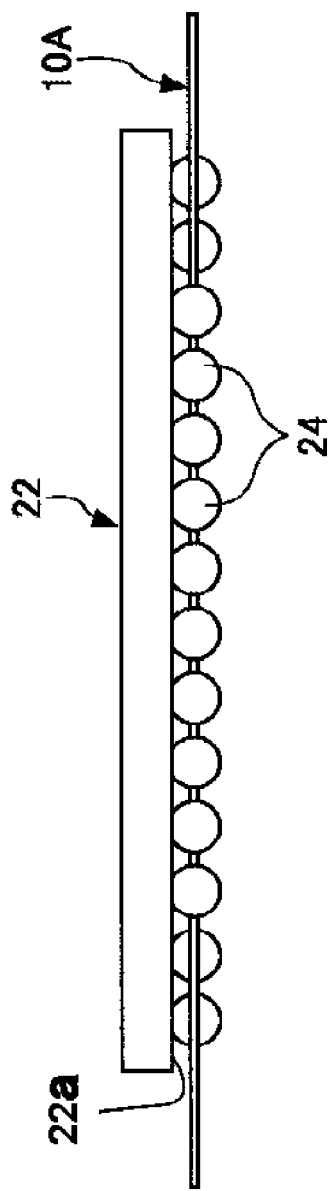
FIGS. 5A and 5B are diagrams illustrating the wiring structure according to the first embodiment attached to the semiconductor package after completion of the reflow process.
Figure 5B:
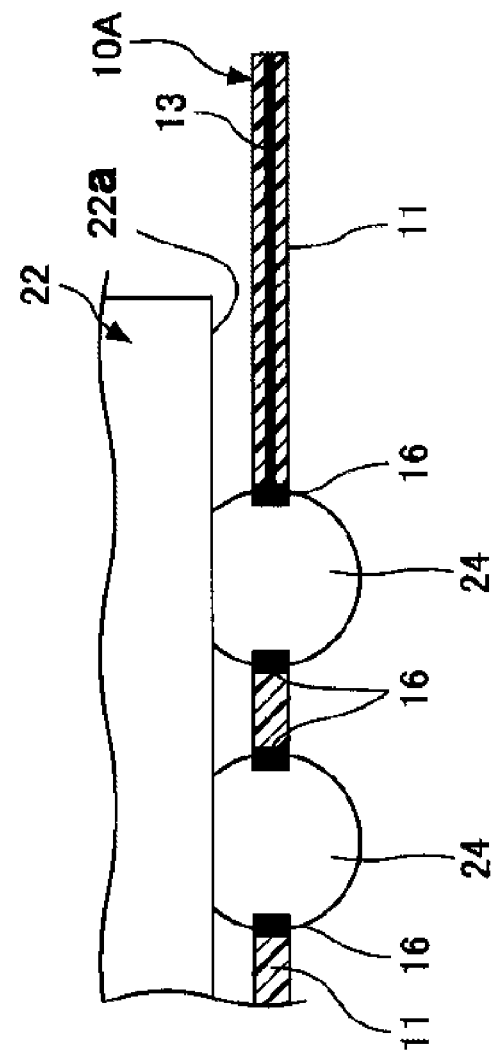

Processes for attaching the wiring film 10A to the semiconductor package 22 will now be described. FIG. 3A is a side elevational view of the wiring film 10A and the semiconductor package 22 and explains an alignment process. FIG. 3B is an enlarged view of the substantial part of the wiring film 10A and that of the semiconductor package 22. FIG. 4 is a diagram explaining a reflow process. FIG. 5A is a side elevational view of the wiring film 10A attached to the semiconductor package 22 after reflow. FIG. 5B is an enlarged view of the substantial part thereof.

To attach the wiring film 10A to the semiconductor package 22, as illustrated in FIG. 3A, the through-holes 12A of the wiring film 10A are aligned with the solder balls 24 in the corners of the semiconductor package 22. Consequently, the through-holes 12A face the solder balls 24, as enlargedly illustrated in FIG. 3B.

Subsequently, the wiring film 10A is placed on the semiconductor package 22 while the above-described alignment state is being kept. Consequently, the outer edge of each through-hole 12A is come into contact with the corresponding solder ball 24.

Reflow is then performed, as illustrated in FIG. 4. This reflow process allows the solder balls 24 to be melted, so that melted solder enters the through-holes 12A. FIG. 5A illustrates the wiring film 10A and the semiconductor package 22 after the reflow process. As described above, the diameter D of each through-hole 12A is smaller than the diameter a of each solder ball 24. Accordingly, the wiring film 10A is fixed to the solder balls 24 such that the wiring film 10A is partially embedded in the solder balls 24 at the completion of the reflow process.

As for the fixing, the wiring film 10A is fixed to substantially the middle part in the height direction (perpendicular to the bottom surface 22a) of each solder ball 24 by the surface tension of the solder ball 24. Accordingly, as enlargedly illustrated in FIG. 5B, the wiring film 10A is apart from the bottom surface 22a of the semiconductor package 22 while being attached to the semiconductor package 22.

Spacers may be previously arranged between the bottom surface 22a and the wiring film 10A in order to allow the wiring film 10A to be apart from the bottom surface 22a of the semiconductor package 22, and reflow may be performed in such a state.

As described above, the outer shape of the wiring film 10A is larger than that of the semiconductor package 22. Accordingly, as illustrated in FIGS. 2A and 2B, the insulating sheet member 11 outwardly extends from the outer edge of the semiconductor package 22.

In addition, the exposed electrode 16 is provided for the outer edge of each through-hole 12A in the wiring film 10A and is connected to the corresponding lead pattern segment 13. Furthermore, since the wiring film 10A is partially embedded in the solder balls 24 while being attached to the semiconductor package 22, each exposed electrode 16 is connected to the circumference of the corresponding solder ball 24.

Consequently, each solder ball 24 is electrically connected to the corresponding lead pattern segment 13, so that the solder ball 24 is led to the outer edge of the insulating sheet member 11 through the exposed electrode 16 and the lead pattern segment 13. Thus, the state of the solder ball 24 may be detected using the lead pattern segment 13.

Figure 6:
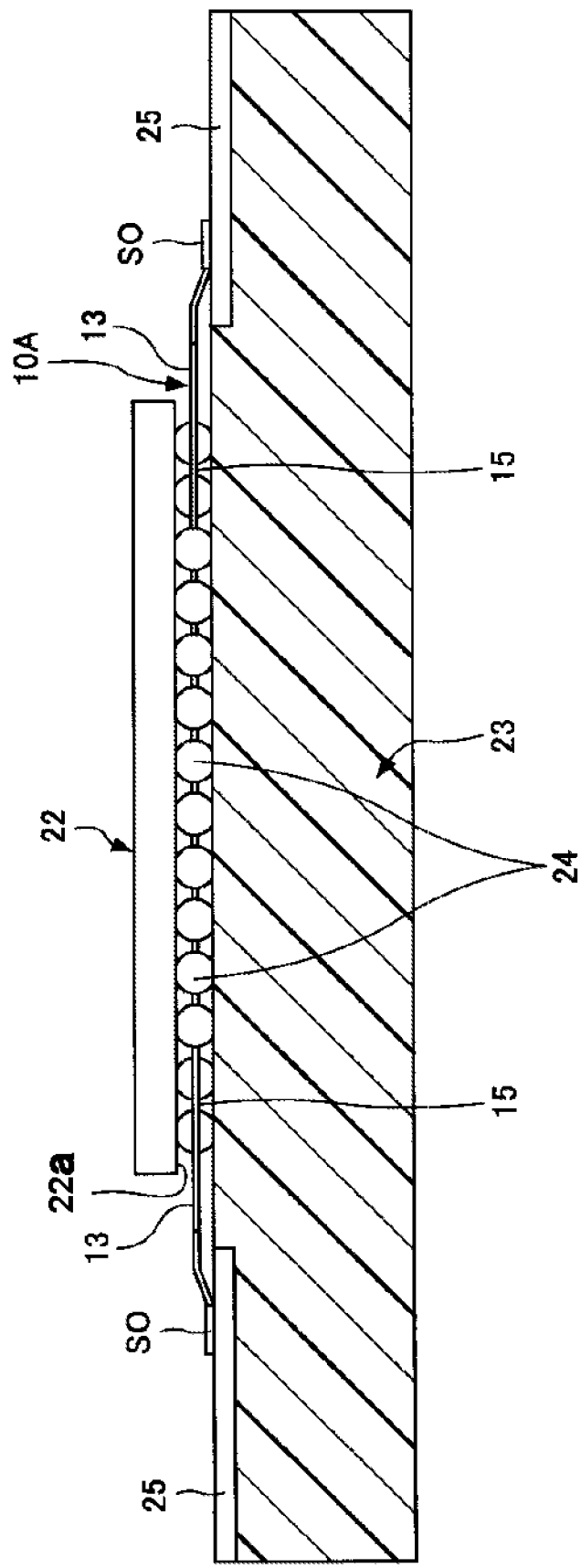
FIG. 6 is a cross-sectional view of a semiconductor device including the wiring structure according to the first embodiment.
Figure 7:
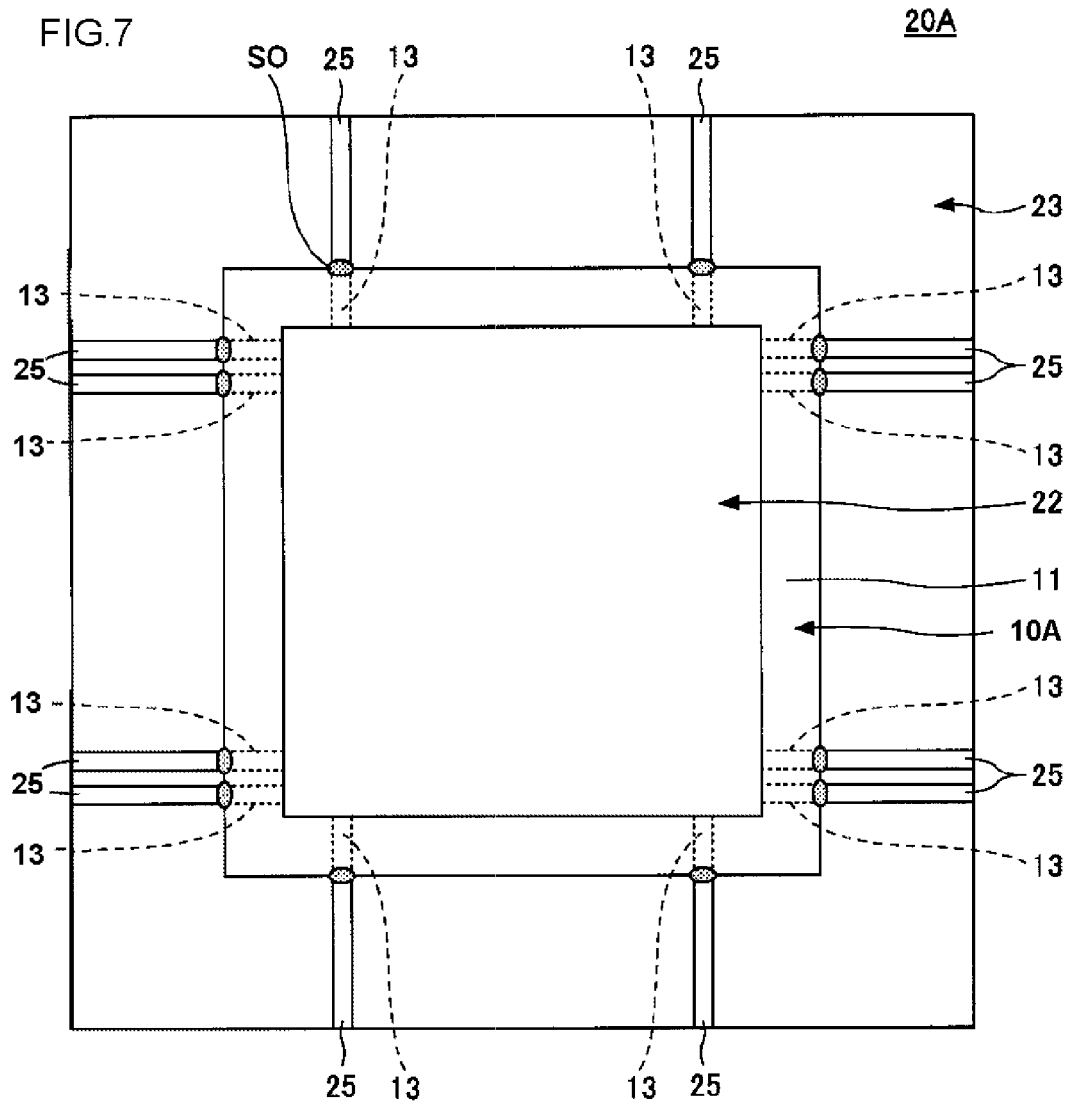
FIG. 7 is a plan view of the semiconductor device in the first embodiment.

FIGS. 6 and 7 illustrates a semiconductor device 20A according to the first embodiment FIG. 6 is a cross-sectional view of a semiconductor device 20A including the wiring film 10A according to the first embodiment. FIG. 7 is a plan view of the semiconductor device 20A. In FIGS. 6 and 7, components corresponding to those in the above-described figures are designated by the same reference numerals. Explanation thereof will be appropriately omitted.

The semiconductor device 20A includes the semiconductor package 22 to which the wiring film 10A is attached as described above, and a printed circuit board 23. The printed circuit board 23 is a substrate made by impregnating glass fabric with epoxy resin, what is called a glass-epoxy substrate. On the surface of the printed circuit board 23, the monitoring pattern 25 and electrode pads (not illustrated) are arranged.

The electrode pads are placed so as to correspond to the solder balls 24 arranged in the grid pattern on the bottom surface 22a of the semiconductor package 22, respectively. The solder balls 24 are joined to the electrode pads (BGA joining), so that the semiconductor package 22 is mounted onto the printed circuit board 23.

The monitoring pattern 25 is disposed so as to correspond to the lead pattern 13. The inner end of each monitoring pattern segment 25 is joined to the corresponding lead pattern segment 13 using solder SO.

Consequently, the monitoring pattern segments 25 are connected to the solder balls 24 through the lead pattern segments 13 and the exposed electrodes 16. In addition, the outer end of each monitoring pattern segment 25 is led to the outer edge of the printed circuit board 23.

The solder balls 24 are joined to the electrode pads arranged in the printed circuit board 23 by reflow. Thus, the solder balls 24 (electrodes) are joined to the printed circuit board 23 through the through-holes 12A in the insulating sheet member 11.

At this time, the wiring film 10A is held at the middle parts of the solder balls 24. Accordingly, while the semiconductor package 22 is mounted on the printed circuit board 23, the wiring film 10A is fixed between the semiconductor package 22 and the printed circuit board 23 such that the wiring film 10A is not in contact with them.

The semiconductor device 20A in the first embodiment has the structure in which the semiconductor package 22 is BGA-joined to the printed circuit board 23. The three solder balls 24 in each corner of the semiconductor package 22 are led to the monitoring pattern 25 through the exposed electrodes 16 and the lead pattern 13. Consequently, states of connection of the solder balls 24 to the semiconductor package 22 and those of the solder balls 24 to the printed circuit board 23 may be detected using the monitoring pattern 25.

At this time, since the solder balls 24 connected to the wiring film 10A are actually BGA-joined to the printed circuit board 23, connection states of the solder balls 24 to the semiconductor package 22 and those of the solder balls 24 to the printed circuit board 23 may also be directly detected using the wiring film 10A. Consequently, the semiconductor device 20A in the first embodiment may allow connection states of the solder balls 24 to the semiconductor package 22 and those of the solder balls 24 to the printed circuit board 23 to be detected with high accuracy.

Figure 8:
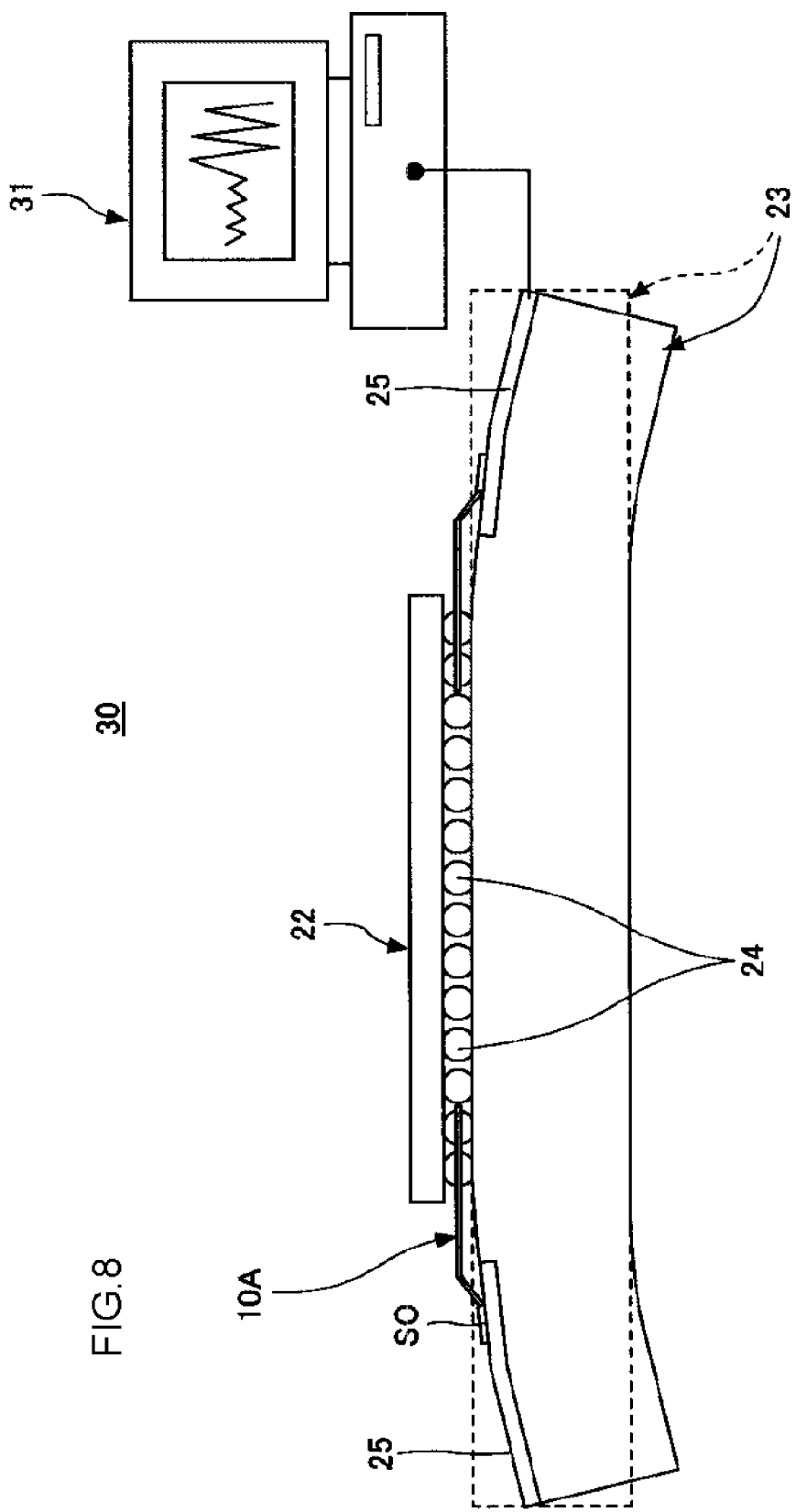
FIG. 8 is a diagram illustrating the structure of a connection-state monitoring apparatus according to an embodiment.

FIG. 8 is a diagram illustrating the structure of a connection-state monitoring apparatus 30 according to an embodiment. In FIG. 8, components corresponding to those in the above-described figures are designated by the same reference numerals. Explanation thereof will be appropriately omitted.

The connection-state monitoring apparatus 30 automatically detects connection states of solder balls 24 when the solder balls 24 on a semiconductor package 22 are BGA-joined to a printed circuit board 23. The connection-state monitoring apparatus 30 includes a wiring film 10A and a detector 31 connected to the wiring film 10A.

In the embodiment, a personal computer is used as the detector 31. The detector 31 performs a connection-state monitoring process illustrated in FIG. 9 to detect connection states of the solder balls 24. In the embodiment, the detector 31 connected to a monitoring pattern 25 detects connection resistances between the solder balls 24 and the semiconductor package 22 and those between the solder balls 24 and the printed circuit board 23, thus detecting connection states of the solder balls 24.

Figure 10A:
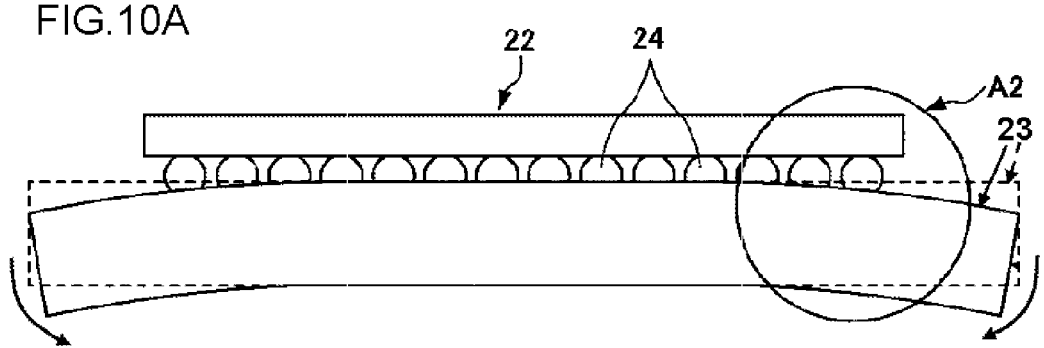
FIGS. 10A to 10C are diagrams explaining the occurrence of solder cracks in corners.
Figure 10B:
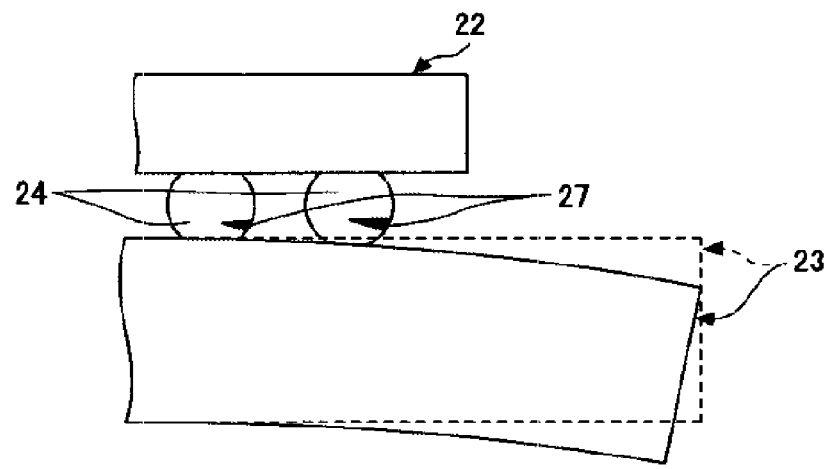
Figure 10C:
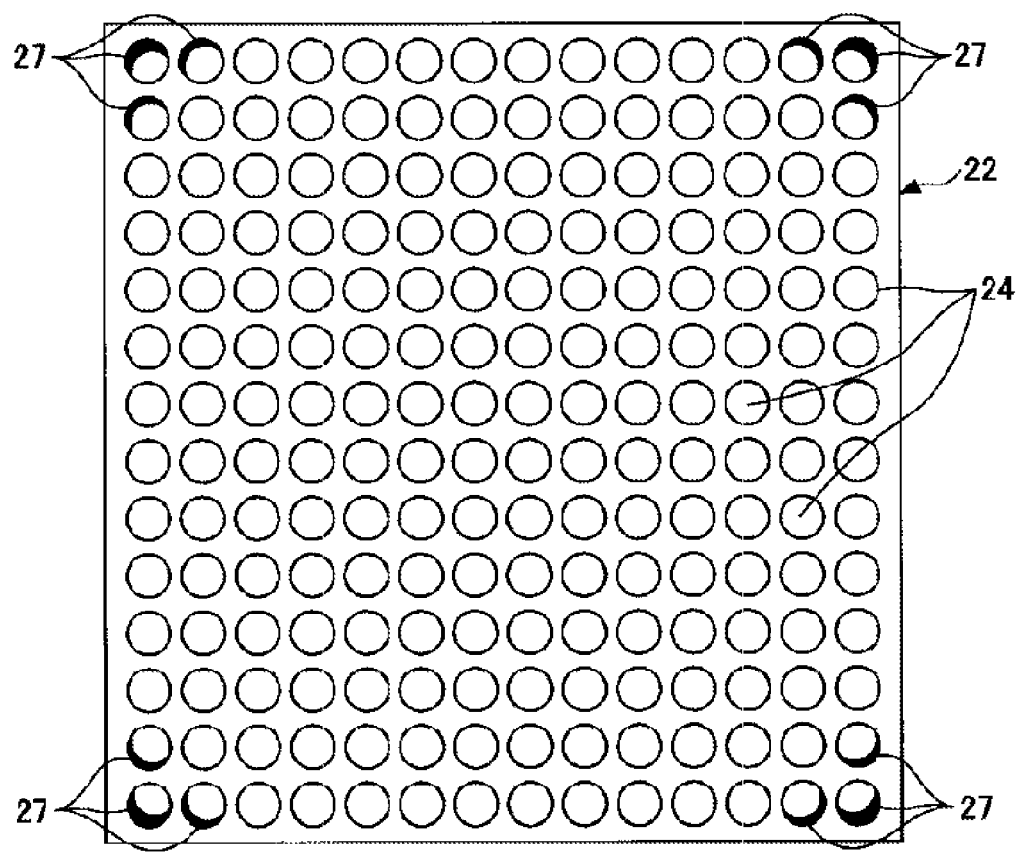

The reason why detecting the above-described connection resistances allows the connection states of the solder balls 24 to be detected and the reason why connecting a lead pattern 13 and the monitoring pattern 25 to the specific solder balls 24 in each corner of the arrangement of the solder balls 24 arranged in a grid pattern on the bottom surface 22a of the semiconductor package 22 allows the connection states of the specific solder balls 24 to be detected will now be described with reference to FIGS. 10A to 10C.

FIG. 10A is a side elevational view of the semiconductor package 22 BGA-joined to the printed circuit board 23 through the solder balls 24. FIG. 10B is an enlarged view of part indicated by the arrow A2 in FIG. 10A. FIG. 10C is a view of the bottom surface of the semiconductor package 22. The semiconductor package 22 typically has a lower coefficient of thermal expansion than that of the printed circuit board 23 which serves as a resin substrate, such as a glass-epoxy substrate. Particularly, when the semiconductor package 22 is a package made of ceramic (what is called a ceramic BGA package), the difference in thermal expansion coefficient therebetween is large.

The above-described difference in thermal expansion coefficient between the semiconductor package 22 and the printed circuit board 23 allows the printed circuit board 23 to extend relative to the semiconductor package 22 upon heating during mounting or the like, thus causing the printed circuit board 23 to curve (warp). In FIGS. 10A and 10B, each dashed line indicates the state of the printed circuit board 23 before curving and each solid line indicates the state thereof after curving.

The printed circuit board 23 is caused to curve as described above, thus causing stress in the solder balls 24 joining the semiconductor package 22 and the printed circuit board 23 together. When the stress is large, solder cracks 27 occur in the positions where the solder balls 24 are joined to the semiconductor package 22 or the positions where the solder balls 24 are joined to the printed circuit board 23, as illustrated in FIG. 10B.

When the solder cracks 27 occur in the solder balls 24 as described above, the electrical resistances of the solder balls 24 increase. Accordingly, when a resistance detected through the monitoring pattern 25 is higher than a normal value (predetermined value derived from experience), the detector 31 determines the occurrence of a solder crack 27 in the solder balls 24.

When the printed circuit board 23 curves, the amount of curving of the outer part of the printed circuit board 23 is larger than that of the central part (refer to FIG. 10A). As for stress caused in the solder balls 24, therefore, stress caused in the solder balls 24 located in the outer part of the semiconductor package 22 is larger than that caused in the solder balls 24 located in the central part of the semiconductor package 22.

Specifically, large stress is caused in the solder balls 24 arranged in each corner that is the farthest from the center of the semiconductor package 22 of the solder balls 24 arranged in the grid pattern on the bottom surface 22a of the semiconductor package 22. In other words, the solder cracks 27 are caused in the solder balls 24 arranged in the corners away from the center of the semiconductor package 22, as illustrated in FIG. 10C.

In the embodiment, the solder balls 24, in which such a solder crack 27 may easily occur, arranged in the corners of the semiconductor package 22 are connected to the detector 31 using the lead pattern 13 in the wiring film 10A and the monitoring pattern 25. Consequently, the occurrence of a solder crack 27 (connection defect) in the solder balls 24 may be detected early and reliably. In addition, since a solder crack 27 caused in the solder balls 24 used for mounting is directly detected in the embodiment, the occurrence of the solder crack 27 (connection defect) may be detected more accurately than the conventional methods of indirectly detecting a connection defect.

In addition, when the semiconductor package 22 with the attached wiring film 10A is mounted onto the printed circuit board 23, the wiring film 10A is fixed at substantially the midpoint between the semiconductor package 22 and the printed circuit board 23 as described above. Thus, the wiring film 10A is not in contact with the semiconductor package 22 and the printed circuit board 23.

A position where a solder crack 27 may occur in any solder ball 24 is in the vicinity of the position where the solder ball 24 is joined to the semiconductor package 22 or the position where the solder ball 24 is joined to the printed circuit board 23. Since the wiring film 10A is fixed to the middle part of the solder ball 24 in the height direction thereof, however, stress may be prevented from being applied to the position where the wiring film 10A is connected to the solder ball 24. Accordingly, a connection defect between the wiring film 10A and the solder ball 24 may be prevented from being caused by stress. The above physical relationship between the wiring film 10A and the solder balls 24 also allows accurate detection of a solder crack 27.

Figure 9:
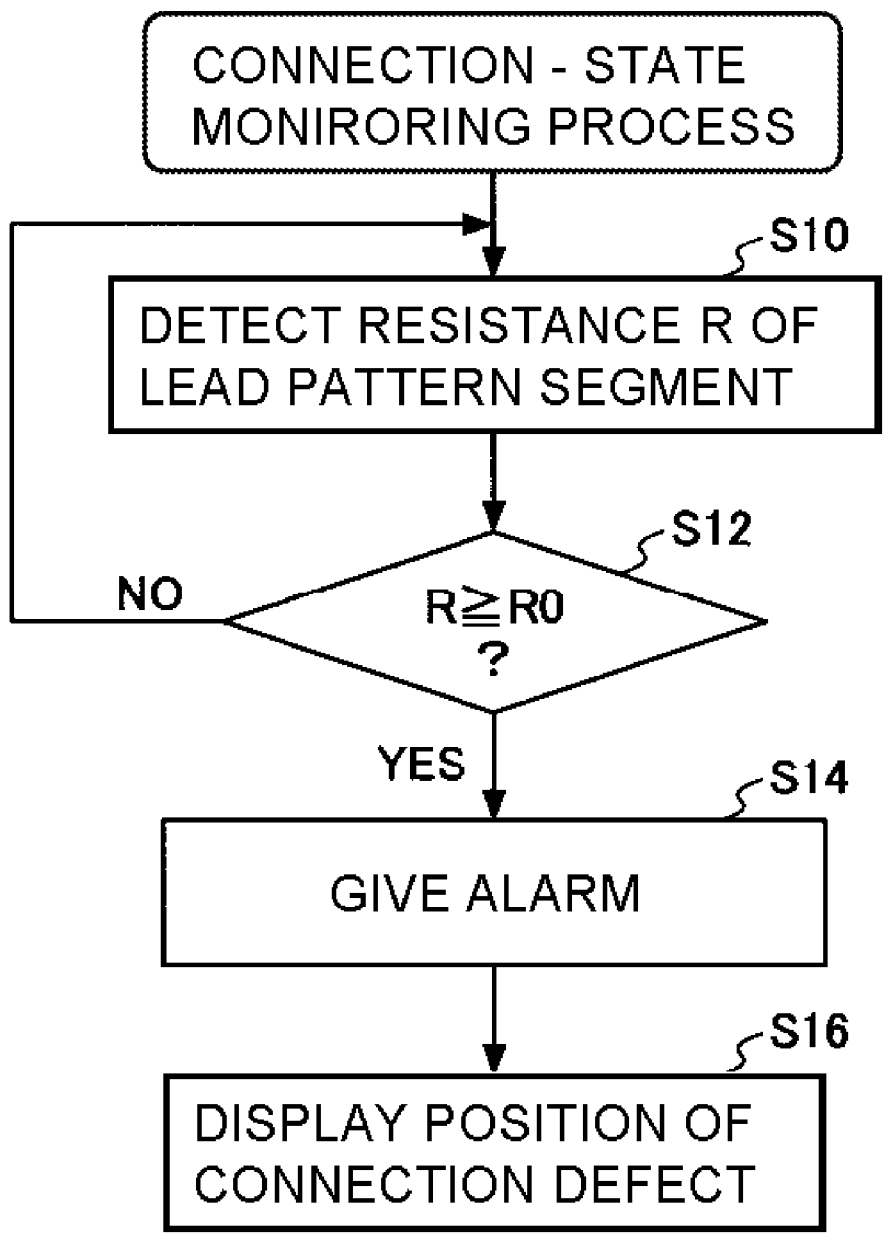
FIG. 9 is a flowchart illustrating a connection-state monitoring process performed by the connection-state monitoring apparatus.

FIG. 9 is a flowchart illustrating the connection-state monitoring process performed by the connection-state monitoring apparatus 30. The detector 31 executes the connection-state monitoring process. When starting the connection-state monitoring process, the detector 31 first detects a resistance R of each lead pattern segment 13 through the monitoring pattern 25 in step S10. As described above, the detector 31 monitors connection states of the 12 solder balls 24 in the embodiment. Accordingly, the detector 31 detects resistances $R_a$ to $R_l$ of the lead pattern segments 13a to 13l connected to the 12 solder balls 24.

In step S12, whether the resistance R of each lead pattern segment 13 detected in step S10 is equal to or higher than a resistance $R_0$ obtained upon occurrence of a crack is determined. The resistance $R_0$ upon crack occurrence is a value derived from experiment. If a solder crack 27 has occurred in any solder ball 24, the resistance $R_0$ appears in the monitoring pattern 25.

Accordingly, when it is determined in step S12 that the resistance R is lower than the resistance $R_0$ upon crack occurrence, the process is returned to step S10 and the detector 31 continues the monitoring process. Whereas, if it is determined in step S12 that the resistance R is equal to or higher than the resistance $R_0$ upon crack occurrence, the detector 31 gives the alarm in step S14 and displays the position of the solder ball 24 having a connection defect in step S16. Advantageously, the connection-state monitoring apparatus 30 may reliably and easily detect the occurrence of a connection defect, such as a solder crack 27, in any solder ball 24.

FIGS. 11 and 12 illustrates a wiring film 10B according to a second embodiment and a semiconductor device 20B including the wiring film 10B. In FIGS. 11 and 12, components corresponding to those in the foregoing figures are designated by the same reference numerals. Explanation thereof will be appropriately omitted.

The wiring film 10A according to the foregoing first embodiment has the structure in which the lead pattern 13 is connected to the solder balls 24 arranged in the corners, which are likely to suffer from solder cracks 27, of the semiconductor package 22. On the other hand, in the wiring film 10B according to the embodiment, through-holes 12B are formed in all of the positions corresponding to the positions of arranged solder balls 24 in an insulating sheet member 11.

As for the lead pattern 13, an exposed electrode 16 may be provided for each of the through-holes 12B and may be connected to a lead pattern segment 13. Alternatively, the lead pattern segments 13 may be connected to the exposed electrodes 16 provided for the through-holes 12B corresponding to the solder balls 24 which are especially intended to be subjected to connection detection. FIG. 11 illustrates a structure in which the lead pattern segments 13 are connected to the exposed electrodes 16 provided for the through-holes 12B corresponding to the specific solder balls 24 (for example, the solder balls 24 connected to signal connection pads). A monitoring pattern 25 disposed in a printed circuit board 23 is joined to the lead pattern 13 placed in the wiring film 10B using solder SO.

The wiring film 10B according to the embodiment may detect connection states of all of or necessary solder balls 24 arranged on a semiconductor package 22. Accordingly, the connection states of the solder balls 24 may be detected in more detail.

Figure 13A:
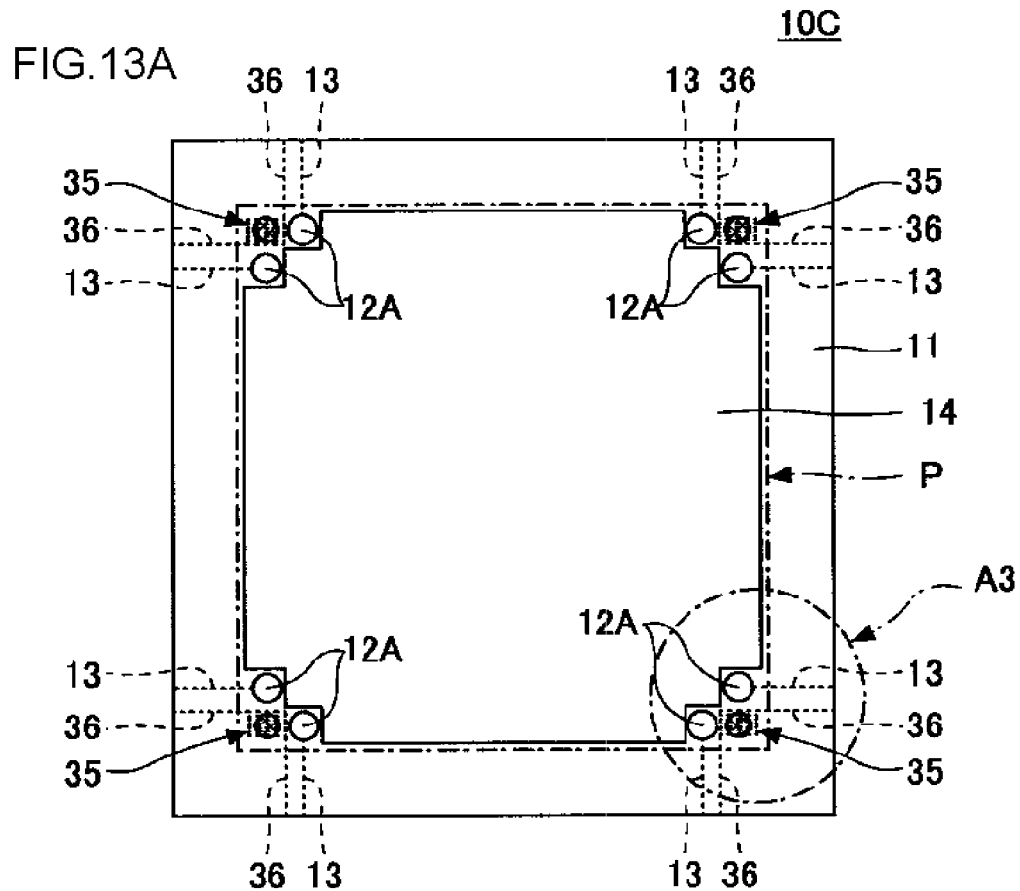
FIGS. 13A to 13C are diagrams illustrating a wiring structure according to a third embodiment.
Figure 13B:
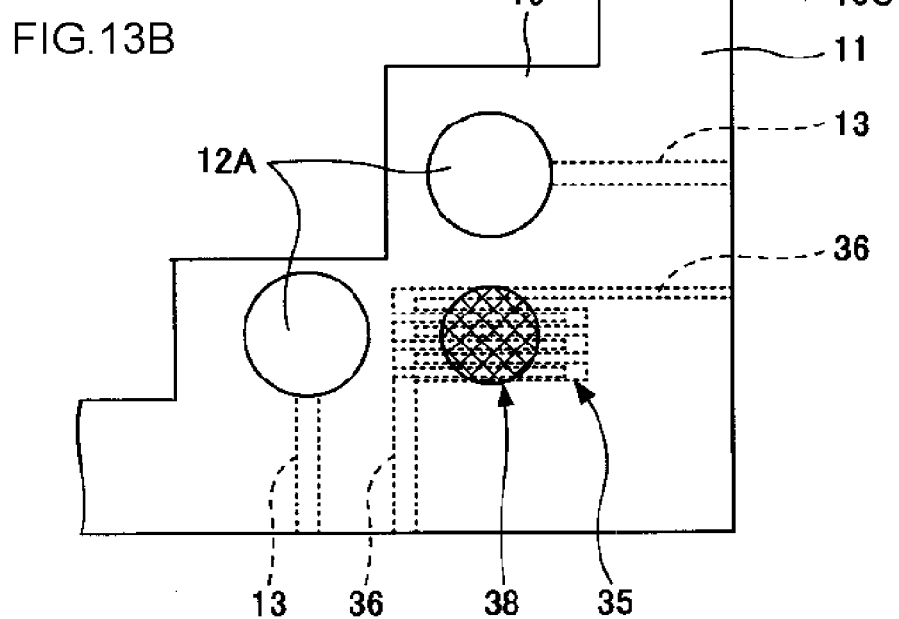
Figure 13C:
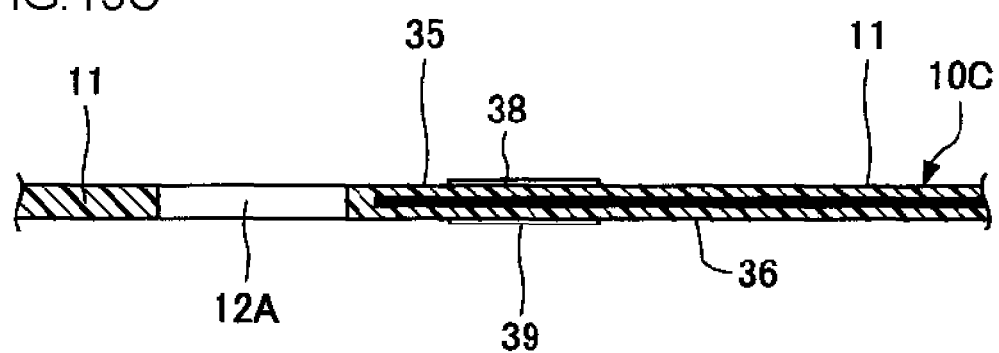

FIG. 13A is a plan view of a wiring film 10C according to a third embodiment. FIG. 13B is an enlarged view of part indicated by the arrow A3 in FIG. 13A. FIG. 13C is a cross sectional view of the part. In FIGS. 13A to 13C, components corresponding to those in the foregoing figures are designated by the same reference numerals. Explanation thereof will be appropriately omitted.

The wiring film 10C includes a frame-shaped insulating sheet member 11 in the same way as the wiring film 10A according to the first embodiment and further includes through-holes 12A and lead pattern segments 13 in each corner of the insulating sheet member 11. The wiring film 10C according to the embodiment further includes a strain gauge 35 in each corner of the insulating sheet member 11 (refer to FIG. 13A).

The strain gauges 35 are embedded in the insulating sheet member 11. Each strain gauge 35 is made of a resistive metallic film. Each end of the strain gauge 35 is connected to one gauge lead pattern segment 36. The other end of the gauge lead pattern segment 36 is led to the outer edge of the insulating sheet member 11.

The strain gauges 35 are arranged in the positions corresponding to the solder balls located in the corners of the arrangement of the solder balls 24 on a semiconductor package 22. When a load is applied to the position of any strain gauge 35, the strain gauge 35 is deformed, so that its resistance varies. Strain caused in the position of the strain gauge 35 may be detected on the basis of the variation in resistance.

Referring to FIG. 13C, a ball-side connection pad 38 is placed in the position corresponding to each strain gauge 35 on the front surface of the insulating sheet member 11 and a printed-circuit-board-side connection pad 39 is placed in the position corresponding to the strain gauge 35 on the rear surface of the insulating sheet member 11. The ball-side connection pad 38 is joined to a small-diameter solder ball 40, which will be described later, placed on the semiconductor package 22. The printed-circuit-board-side connection pad 39 is joined to a small-diameter solder ball 41. The connection pads 38 and 39 are electrically independent of each other. Accordingly, the small-diameter solder balls 40 and 41 are also electrically independent of each other when being joined to the wiring film 10C.

A process of attaching the wiring film 10C to the semiconductor package 22 will now be described with reference to FIGS. 14 and 15.

Figure 14:
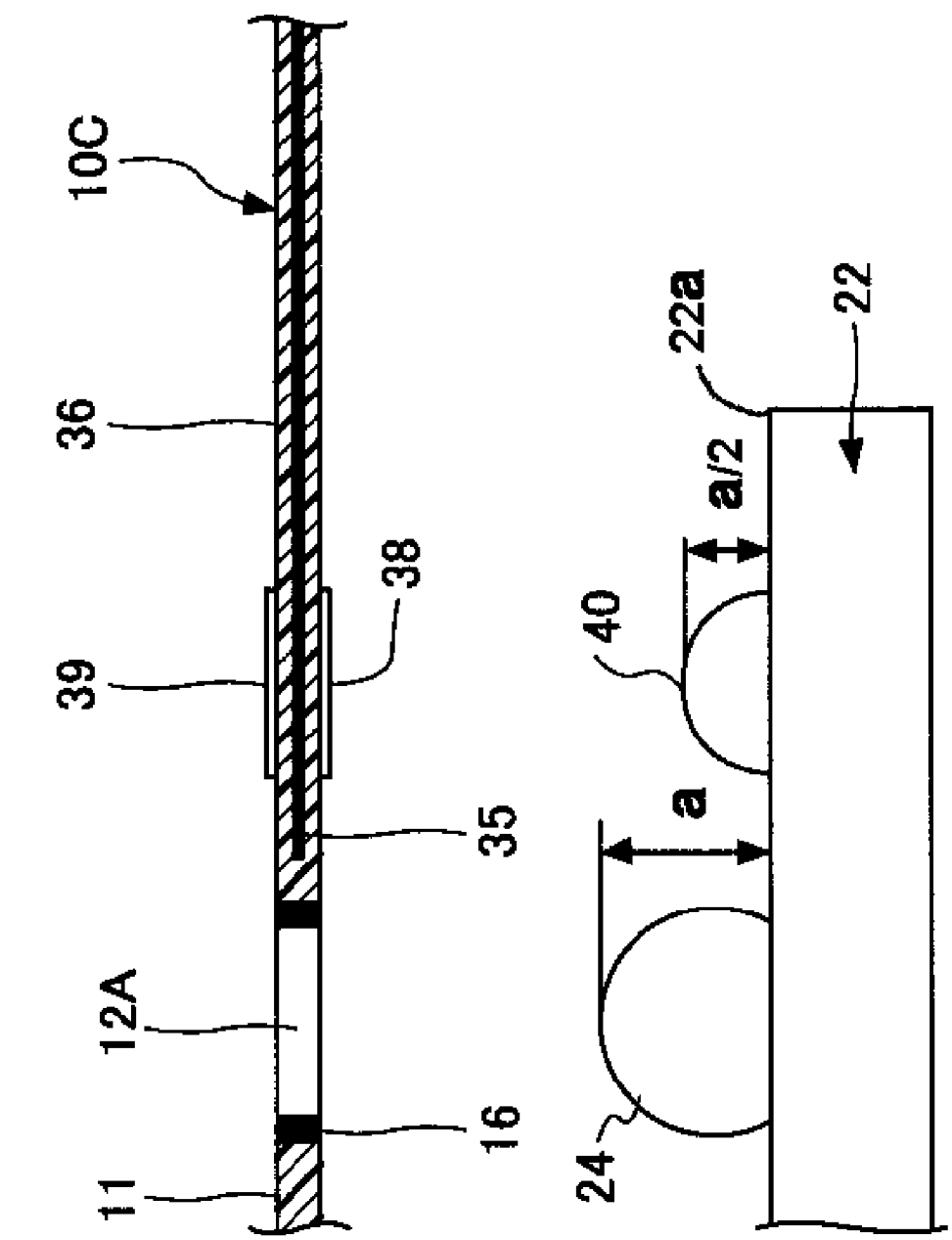
FIG. 14 is a diagram explaining an alignment process performed when the wiring structure according to the third embodiment is attached to a semiconductor package.

To attach the wiring film 10C to the semiconductor package 22, first, each small-diameter solder ball 40 on the semiconductor package 22 is aligned with the corresponding ball-side connection pad 38 and each solder ball 24 next to the small-diameter solder ball 40 is also aligned with the corresponding through-hole 12A, as illustrated in FIG. 14. At this time, the height of the small-diameter solder ball 40 on the semiconductor package 22 (the height thereof relative to the bottom surface 22a of the semiconductor package 22) is set to be lower than that of the semiconductor package 22. Specifically, the height of the small-diameter solder ball 40 is set to half the diameter a of the solder ball 24, namely, a/2.

The small-diameter solder balls 40 are used for detection of connection states of the solder balls 24. Accordingly, the small-diameter solder balls 40 are not solder balls that electrically connect the semiconductor package 22 to a printed circuit board 23.

Subsequently, while the above-described alignment is being held, the wiring film 10C is mounted onto the semiconductor package 22. Thus, each small-diameter solder ball 40 is in contact with the corresponding ball-side connection pad 38 and the outer edge of each through-hole 12A is in contact with the corresponding solder ball 24.

After that, a reflow process is performed. The reflow process allows the solder balls 24 to be melted, so that the solder balls 24 are inserted into the through-holes 12A in the same way as the first embodiment. In addition, the small-diameter solder balls 40 are joined to the ball-side connection pads 38.

Figure 15:
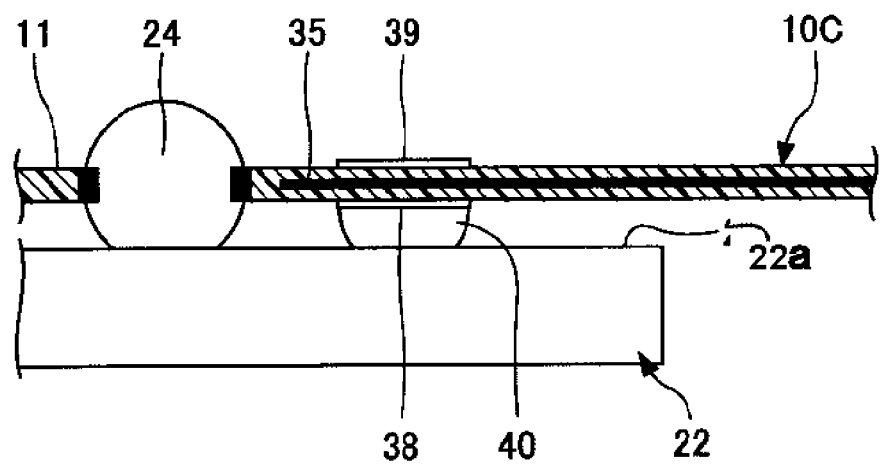
FIG. 15 is a diagram explaining a reflow process performed when the wiring structure according to the third embodiment is attached to the semiconductor package.

FIG. 15 illustrates the wiring film 10C and the semiconductor package 22 after completion of the reflow process. As described above, the height of each small-diameter solder ball 40 is half (a/2) the diameter a of each solder ball 24. Accordingly, the wiring film 10C is fixed to the middle parts of the solder balls 24 at the time when the reflow process is completed. The wiring film 10C is therefore apart from the bottom surface 22a of the semiconductor package 22 while being attached to the semiconductor package 22.

In the embodiment, the insulating sheet member 11 extends from the outer edge of the semiconductor package 22. Accordingly, strain detected by any strain gauge 35 may be detected through the gauge lead pattern 36.

Figure 16:
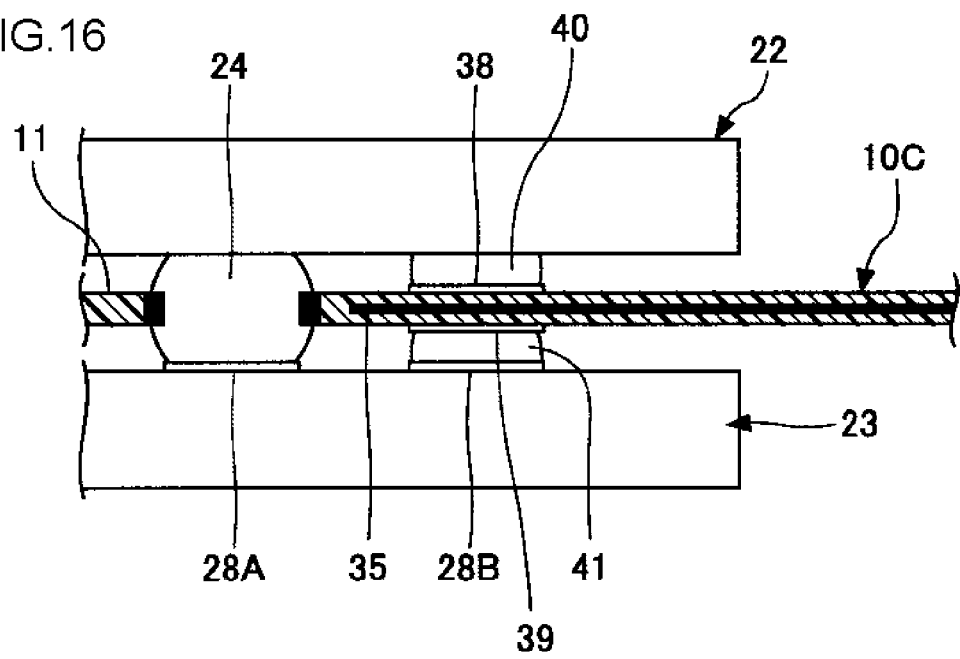
FIG. 16 is an enlarged view of substantial part of a semiconductor device including the wiring structure according to the third embodiment.

FIG. 16 is an enlarged view of substantial part of a semiconductor device 20C including the wiring film 10C according to the third embodiment. In FIG. 16, components corresponding to those in the foregoing figures are designated by the same reference numerals. Explanation thereof will be appropriately omitted.

The semiconductor device 20C includes the semiconductor package 22 to which the wiring film 10C is attached and the printed circuit board 23. The printed circuit board 23 is provided with substrate electrodes 28A and 28B. Each substrate electrode 28A is BGA-joined to the solder ball 24 on the semiconductor package 22. Each substrate electrode 28B is placed in the position corresponding to the printed-circuit-board-side connection pad 39. The substrate electrode 28B is joined to the printed-circuit-board-side connection pad 39 through the small-diameter solder ball 41. In addition, the edge of the wiring film 10C is connected to a monitoring pattern (not illustrated) provided for the printed circuit board 23 by soldering.

Figure 17:
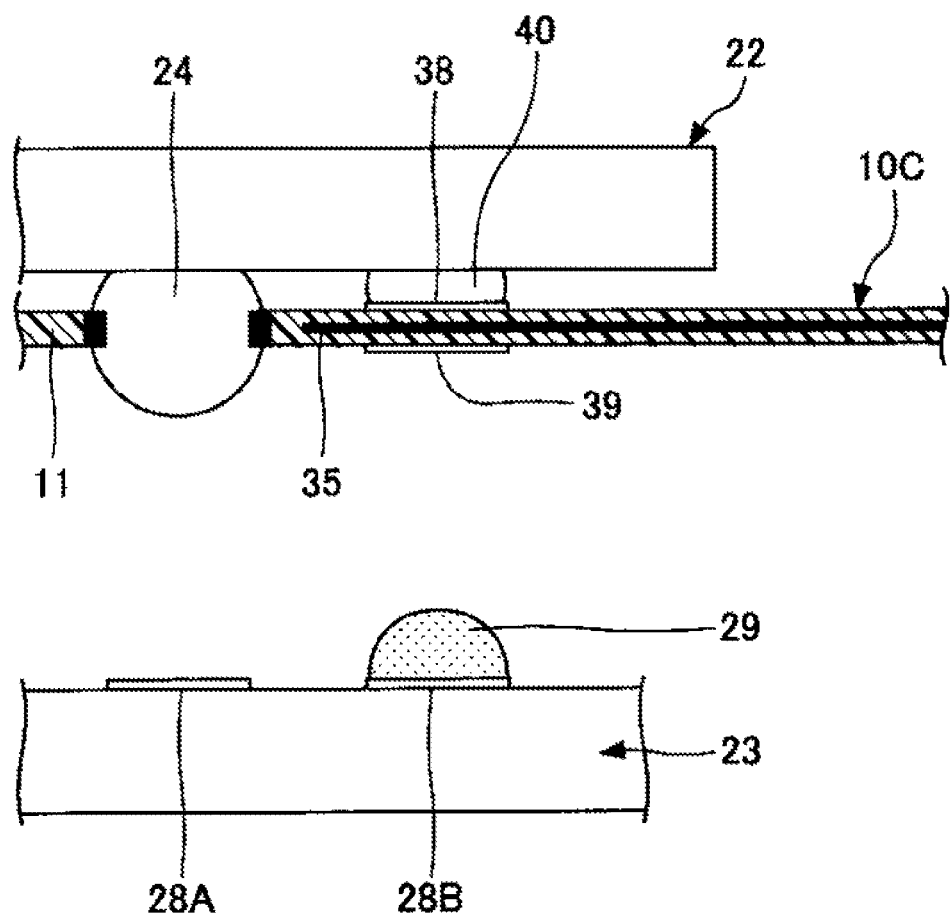
FIG. 17 is a diagram explaining a process of mounting the semiconductor package to which the wiring structure according to the third embodiment is attached onto a printed circuit board.

FIG. 17 illustrates a process of mounting the semiconductor package 22 to which the wiring film 10C is attached onto the printed circuit board 23. To mount the semiconductor package 22 onto the printed circuit board 23, first, solder paste 29 is applied to each substrate electrode 28B. The amount of solder contained in the solder paste 29 is set so that the small-diameter solder ball 41 may be formed between the wiring film 10C and the printed circuit board 23.

Subsequently, the solder ball 24 is aligned with the substrate electrode 28A and the printed-circuit-board-side connection pad 39 is aligned with the substrate electrode 28B. After that, the solder ball 24 is come into contact with the substrate electrode 28A and the printed-circuit-board-side connection pad 39 is come into contact with the solder paste 29. In this state, the semiconductor package 22 and the printed circuit board 23 are subjected to reflow, so that the solder ball 24 is BGA-joined to the substrate electrode 28A and the printed-circuit-board-side connection pad 39 is joined to the substrate electrode 28B through the small-diameter solder ball 41.

In the embodiment, the wiring film 10C is not in contact with the semiconductor package 22 and the printed circuit board 23. The small-diameter solder balls 40 and 41 are arranged in the corners of the semiconductor package 22 in which stress may easily occur when the printed circuit board 23 is caused to curve. In addition, the small-diameter solder balls 40 and 41 are joined to the connection pads 38 and 39 arranged in the vicinity of each strain gauge 35, respectively.

Accordingly, if the printed circuit board 23 is caused to curve and stress is caused in any solder ball 24, this stress is applied to the corresponding strain gauge 35 through the small-diameter solder ball 40 or 41. Thus, the resistance of the strain gauge 35 varies. The variation in resistance may be detected through the gauge lead pattern 36.

Strain detected by the strain gauge 35 has a correlation to solder fracture stress that causes a solder crack 27 in the solder ball 24. Accordingly, when stress in the small-diameter solder balls 40 and 41 is detected through the strain gauges 35, the connection reliabilities of the solder balls 24 may be estimated. As described above, in the embodiment, stress caused in the placement position of each solder ball 24 may be directly detected (in the embodiment, the corners are used for placement of the small-diameter solder balls 40 dedicated for strain detection). Advantageously, connection states of the solder balls 24 to the semiconductor package 22 and the printed circuit board 23 may be detected with high accuracy.

The above-described embodiment has been described with respect to the case where the strain gauges 35, the through-holes 12A, and the lead pattern 13 are provided for the wiring film 10C. However, both of the strain gauges 35 and the through-holes 12A are not necessarily provided for the wiring film 10C. If only the strain gauges 35 are arranged in a wiring structure, connection states of the solder balls 24 may also be detected.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
    a semiconductor package;
    a circuit board;
    an interconnection electrically connecting the semiconductor package and the circuit board; and
    a wiring structure including a through hole, a contact disposed at the through hole and a lead pattern extending from the contact and to an outside area of a periphery of the semiconductor package, the wiring structure being disposed between the semiconductor package and the circuit board, wherein the interconnection passes through the through hole and connects with the contact.

2. The semiconductor device according to claim 1, wherein the wiring structure is supported by the interconnection at a position which is apart from both of the semiconductor package and the circuit board.

3. The semiconductor device according to claim 1, wherein the interconnection comprises a solder.

4. The semiconductor device according to claim 1, wherein the through hole is located at a position corresponding to a corner of the semiconductor package.

5. The semiconductor device according to claim 1, wherein the wiring structure is embedded in the interconnection.

6. The semiconductor device according to claim 1, further comprising:
    a strain gauge provided in the wiring structure; and
    a bonding bump bonding the semiconductor package and the wiring structure at a position corresponding to the strain gauge.

7. The semiconductor device according to claim 1, further comprising:
    a strain gauge provided in the wiring structure; and
    a bonding bump bonding the circuit board and the wiring structure at a position corresponding to the strain gauge.

8. The semiconductor device according to claim 7, wherein a height of the bonding bump is lower than a height of the interconnection.

9. The semiconductor device according to claim 7, wherein a height of the bonding bump is lower than a height of the interconnection.

10. A wiring structure for a ball grid array package, the wiring structure comprising:
    an insulating sheet member having a through hole, the through hole being configured for a solder ball of the ball grid array package to pass therethrough;
    a conductive contact exposed at the through hole;
    a lead pattern interposed within the insulating sheet member and connected to the conductive contact and
    a strain gauge provided in the insulating sheet member and located at a position which is opposite to the ball grid array package.

11. The wiring structure according to claim 10, wherein an internal diameter of the through hole is larger than an external diameter of the solder ball.

12. A semiconductor package comprising:
    a package body including a ball grid array; and
    a wiring structure including a sheet member having a through hole, a contact disposed at the through hole and a lead pattern extending from the contact and to an outside area of a periphery of the package body, wherein a solder ball of the ball grid array passes through the through hole and connects with the contact.

13. The semiconductor package according to claim 12, wherein the wiring structure is supported by the solder ball at a position which is apart from the package body.

14. The semiconductor package according to claim 12, wherein the through hole is located at a position corresponding to a corner of the package body.

15. The semiconductor package according to claim 12, wherein the sheet member is embedded in the solder ball of the ball grid array.

16. The semiconductor package according to claim 12, further comprising:
    a strain gauge provided in the sheet member; and
    a bonding bump bonding the package body and the wiring structure at a position corresponding to the strain gauge.

* * * * *